United States Patent
Hu

(10) Patent No.: US 11,233,071 B2
(45) Date of Patent: Jan. 25, 2022

(54) ELECTRODE STRUCTURE AND ARRAY SUBSTRATE

(71) Applicant: SHENZHEN CHINA STAR OPTOELECTRONICS TECHNOLOGY CO., LTD., Guangdong (CN)

(72) Inventor: Xiaobo Hu, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 623 days.

(21) Appl. No.: 16/080,259

(22) PCT Filed: Jun. 11, 2018

(86) PCT No.: PCT/CN2018/090668
§ 371 (c)(1),
(2) Date: Aug. 27, 2018

(87) PCT Pub. No.: WO2019/227521
PCT Pub. Date: Dec. 5, 2019

(65) Prior Publication Data
US 2021/0098495 A1    Apr. 1, 2021

(30) Foreign Application Priority Data
May 28, 2018 (CN) .......................... 201810524716.X

(51) Int. Cl.
*H01L 27/12* (2006.01)

(52) U.S. Cl.
CPC ........ *H01L 27/124* (2013.01); *H01L 27/1259* (2013.01)

(58) Field of Classification Search
CPC ........ H01L 29/43; H01L 27/12; H01L 21/283
See application file for complete search history.

(56) References Cited

U.S. PATENT DOCUMENTS

| | | | |
|---|---|---|---|
| 8,502,285 B2* | 8/2013 | Mori | H01L 29/458 257/288 |
| 10,224,409 B2* | 3/2019 | Huang | H01L 29/1606 |
| 2010/0096172 A1* | 4/2010 | Tatsumi | H01L 21/76867 174/257 |
| 2013/0122323 A1 | 5/2013 | Miki et al. | |
| 2017/0088965 A1* | 3/2017 | Murata | C25D 5/34 |
| 2018/0245230 A1* | 8/2018 | Sonoda | C25D 5/505 |

FOREIGN PATENT DOCUMENTS

| | | |
|---|---|---|
| CN | 1288072 A | 3/2001 |
| CN | 103003860 A | 3/2013 |
| CN | 103094184 A | 5/2013 |
| CN | 103503117 A | 1/2014 |
| CN | 104952930 A | 9/2015 |

* cited by examiner

*Primary Examiner* — Dung A. Le
(74) *Attorney, Agent, or Firm* — Leong C. Lei

(57) ABSTRACT

An electrode structure which includes a copper metal layer formed on a substrate, wherein the copper metal layer doped with a first metal ion within a first depth from upper surface, the first metal ion and the copper grain forming a copper alloy layer; the first depth being less than thickness of the copper metal layer, and the first metal ion being a metal ion having corrosion resistance and an ionic radius smaller than a gap between copper grains.

13 Claims, 2 Drawing Sheets

ELECTRODE STRUCTURE AND ARRAY SUBSTRATE

RELATED APPLICATIONS

The present application is a National Phase of International Application Number PCT/CN2018/090668, filed Jun. 11, 2018, and claims the priority of China Application No. 201810524716.X, filed May 28, 2018.

BACKGROUND OF THE INVENTION

1. Field of the Invention

The present invention relates to the field of display, and in particular to the field of an electrode structure and manufacturing method thereof, and also to an array substrate with aforementioned semiconductor device.

2. The Related Arts

A panel display device has many advantages such as thinness, power saving, no radiation, and has been widely used. The conventional panel display devices mainly include liquid crystal display (LCD) devices and organic light-emitting diode (OLED) display devices. A thin film transistor (TFT) array substrate is an important component of a panel display device and can be formed on a glass substrate or a plastic substrate.

As the resolution and the size of the display panel increase, the signal delay phenomenon has become more serious, and reducing the wiring resistance becomes an urgent requirement. Copper (Cu) is second only to silver (Ag) in conductivity. The copper raw material is inexpensive and is considered the most promising low-resistivity wiring material. In the prior art, copper has been used as a wiring material on array substrate, for example, copper is used as a gate, a source, a drain, and so on of the TFT on the array substrate.

However, the use of copper as a wiring material on an array substrate poses a problem in the prior art: in the known array substrate process, after the copper thin film layer is deposited, the copper thin film layer is subjected to a yellow light process and an etching process. During the processes, the copper thin film layer is exposed to the air and the copper at the surface is partially oxidized. Specifically, when the copper thin film layer is exposed to air for more than 30 minutes, the surface resistivity thereof is increased by more than 30%, thereby causing an increase in wiring resistance and a decrease in signal transmission performance of the device. Furthermore, the more the thickness of the copper thin film layer, the larger the crystal grain size, the higher the surface roughness, the larger the gap between the crystal grains. Therefore, in the subsequent processes, some $O_2$ and $H_2O$ will penetrate into the inside of the thin film along the gap between the grains to accelerate the oxidation of the surface copper film. In addition, CuO, and $Cu(OH)_x$ produced by oxidation of the surface of the copper thin film layer cause electro-static discharge (ESD), which causes damage to the device.

Therefore, when copper is used as the wiring material on the array substrate, for example, as an electrode material, how to prevent the surface of the copper thin film layer from oxidation becomes an issue to be addressed.

SUMMARY OF THE INVENTION

To overcome the aforementioned problems in the prior art, the present invention provides T an electrode structure and a manufacturing method thereof, using copper as an electrode material and avoiding the problem of the surface of the copper thin film layer from oxidation, applicable to a semiconductor device, and able to improve the signal transmission capability of the semiconductor device.

To achieve the above object, the present invention provides the following technical solution:

an electrode structure, comprising a copper metal layer formed on a substrate, wherein the copper metal layer, being doped with a first metal ion within a first depth from upper surface, the first metal ion and the copper grain being combined by a metal bond to form a copper alloy layer; the first depth being less than thickness of the copper metal layer, and the first metal ion being a metal ion having corrosion resistance and an ionic radius smaller than a gap between copper grains.

Wherein, the first metal ion is selected from one or more of nickel ion, tungsten ion, and tantalum ion.

Wherein, the first depth range is 100 Å to 500 Å.

Wherein, a connection metal layer is disposed between the copper metal layer and the substrate.

Wherein, the material of the connecting metal layer is molybdenum or titanium or a combination of the two.

Wherein, the connecting metal layer has a thickness of 100 Å to 500 Å.

Wherein, the copper metal layer has a thickness of 2000 Å to 10000 Å.

The present invention also provides a manufacturing method of the above electrode structure, which comprises:

providing a substrate and forming a copper metal layer on the substrate by deposition;

applying an ion implantation process to implant a first metal ion to within range of a first depth of the copper metal layer;

applying a vacuum annealing process to anneal the copper metal layer for the first metal ion and the copper grain to be combined by a metal bond to form the copper alloy layer.

Wherein, the vacuum annealing process has an annealing temperature of 200° C. to 400° C. and an annealing time of 10 min to 120 min.

The present invention also provides an array substrate, which comprises: a substrate and a thin film transistor (TFT) disposed on the substrate, the TFT having a gate electrode, a semiconductor active layer, a source electrode, and a drain electrode, wherein at least one of the gate electrode, the source electrode, and the drain electrode employing an electrode structure as described above.

The electrode structure and the manufacturing method thereof provided in the embodiments of the present invention use copper as the conductive functional layer of the electrode structure, thereby realizing the use of a relatively inexpensive material to improve the conductivity of the electrode. Wherein, the first metal ion having corrosion resistance is implanted from the upper surface of the copper metal layer (the implantation depth is smaller than the thickness of the copper metal layer) by using an ion implantation process, and the first metal ion and the copper grain form a copper alloy layer through a metal bond by a vacuum annealing process, whereby the problem of the surface oxidation of the copper metal layer is effectively avoided. In addition, the first metal ion is a metal ion having an ionic radius smaller than a gap between copper grains, which can be filled into the gaps of copper grains in the copper metal layer and can prevent $O_2$ and $H_2O$ from penetrating into the copper metal layer along the gap to oxide the copper metal layer. A copper metal layer having a larger thickness can also be prepared, thereby further improving the electrical conductivity of the electrode structure. The electrode structure is applicable to a semiconductor device on an array substrate, and the signal transmission capability of the semiconductor device can be improved.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

The terms "comprising" and "having" and any variations thereof appearing in the specification, claims, and drawings of the present application are intended to cover non-exclusive inclusion. For example, a process, method, system, product, or device that includes a series of steps or units is not limited to the listed steps or units, but optionally also includes steps or units not listed, or alternatively, other steps or units inherent to these processes, methods, products or equipment. In addition, the terms "first", "second" and "third" are used to distinguish different objects, and are not intended to describe a particular order.

Embodiment 1

Figure 1:
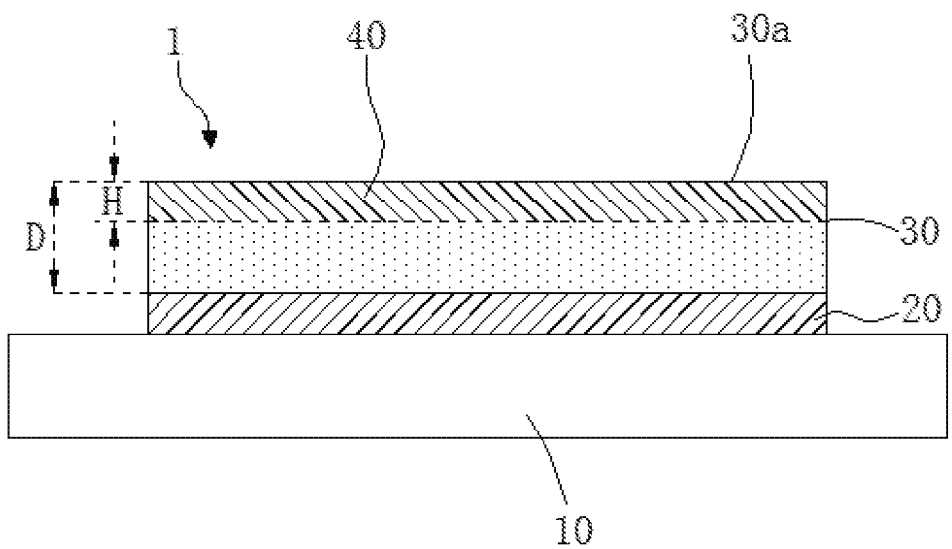
FIG. 1 is a schematic view showing the electrode structure of the embodiment of the present invention.

The present embodiment provides an electrode structure. As shown in FIG. 1, the electrode structure 1 comprises a copper metal layer 30 formed on a substrate 10, and the copper is used as a conductive functional layer of the electrode structure. The copper metal layer 30 is doped with a first metal ion within a range of a first depth H from an upper surface 30a. The first metal ion and the copper grain are combined by a metal bond to form a copper alloy layer 40. The upper surface 30a of the copper metal layer 30 refers to a surface of the copper metal layer 30 facing away from the substrate 10, and the first depth H is smaller than the thickness D of the copper metal layer 30. Specifically, the first metal ion is a metal ion having corrosion resistance and an ionic radius smaller than a gap between copper grains, and the first metal ion may be selected from one or more of the group of nickel (Ni) ions, tungsten (W) ions, and tantalum (Ta) ions.

In the present embodiment, as shown in FIG. 1, to better combine the copper metal layer 30 with the substrate 10 to prevent the copper metal layer 30 from being detached from the substrate 10, a connection metal layer 20 is disposed between the copper metal layer 30 and the substrate 10. The material of the connection metal layer 20 may be selected from molybdenum (Mo) or titanium (Ti) or a combination of both. The substrate 10 is an insulating substrate and may be a substrate of glass or other insulating material such as SiOx or SiNx. It should be noted that when the selected substrate 10 and the copper metal layer 30 have a good bonding force, the connection metal layer 20 may be omitted.

In the present embodiment, the first metal ion is selected to be nickel (Ni) ions, and the copper alloy layer 40 is a copper-nickel alloy layer. Nickel is a metal element which has good corrosion resistance, hard and ductile property and ferromagnetism, and good electrical conductivity. The formed copper-nickel alloy layer can effectively prevent the surface of the copper metal layer from oxidation to improve the electrical conductivity of the electrode structure. In addition, the ionic radius of the nickel ions is small, which can better fill into the copper metal layer 30 to prevent $O_2$ and $H_2O$ from penetrating into the copper metal layer along the gap between copper grains, thereby preventing the copper metal layer from oxidation. Of course, a similar effect can be obtained if the first metal ion is selected to be a tungsten ion or a cerium ion, but the effect is better when the nickel ion is used.

Wherein, the thickness of the copper alloy layer 40 is determined by the size of the first depth H, and the size of the first depth H may be set within a range of 100 Å to 500 Å.

Wherein, the thickness of the connecting metal layer 20 can be set within a range of 100 Å to 500 Å.

As described in the background, when the thickness of the copper thin film layer is larger, the copper grains are larger, the surface roughness is increased, and the gap between the copper grains is also increased. Therefore, $O_2$ and $H_2O$ are more easily to penetrate along the gap between copper grains into the inside of the thin film in subsequent processes to accelerate the oxidation of the surface of copper thin film. In this embodiment, since the first metal ion is a metal ion having corrosion resistance and an ionic radius smaller than a gap between copper grains, the first metal ion may be filled in gaps between copper grains of the copper metal layer to prevent $O_2$ and $H_2O$ from penetrating into the copper metal layer along the gap to avoid oxidation. Therefore, under the premise that other conditions are the same, the electrode structure in this embodiment can be provided with a thicker copper metal layer to further improve the electrical conductivity of the electrode structure. In the present embodiment, the thickness D of the copper metal layer 30 is preferably set in the range of 2000 Å to 10000 Å.

Figure 2A:
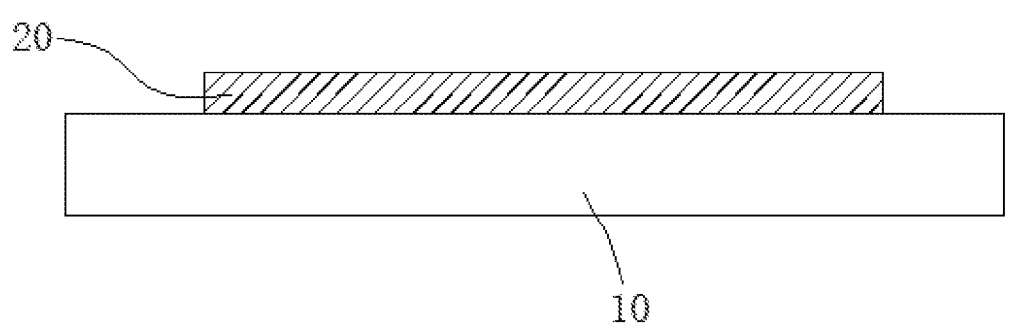
FIGS. 2a-2d are schematic views showing the manufacturing method of electrode structure of the first embodiment of the present invention, corresponding to an obtained device after each step.
Figure 2B:
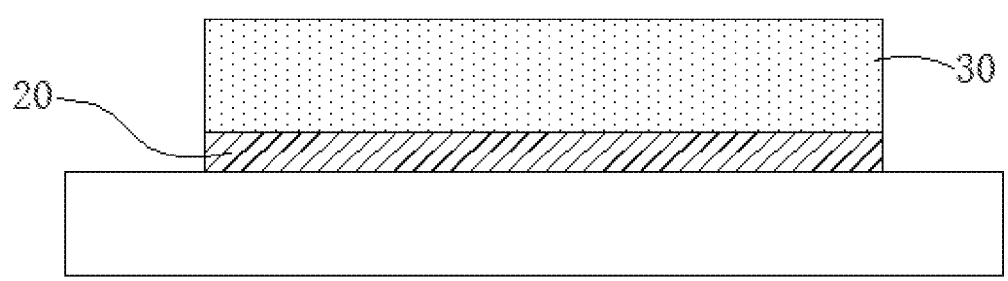

The present embodiment also provides a manufacturing method of the electrode structure as described above, and the process of the manufacturing method will be described below with reference to FIGS. 2a-2d. The manufacturing method comprises the steps of:

S10: referring to FIGS. 2a and 2b, a substrate 10 is provided and deposited on the substrate 10 to form a copper metal layer 30.

First, as shown in FIG. 2a, a connection metal layer 20 is deposited on the substrate 10. The connecting metal layer 20 may be a metal thin film layer of one or two or more layers.

Then, as shown in FIG. 2b, a copper metal layer 30 is deposited on the connection metal layer 20.

It should be noted that the connection metal layer 20 is mainly for better bonding of the copper metal layer 30 and the substrate 10, and therefore, when the selected substrate 10 and the copper metal layer 30 have good bonding force, the bonding metal layer 20 may be omitted and the copper metal layer 30 is deposited directly on the substrate 10.

Figure 2C:
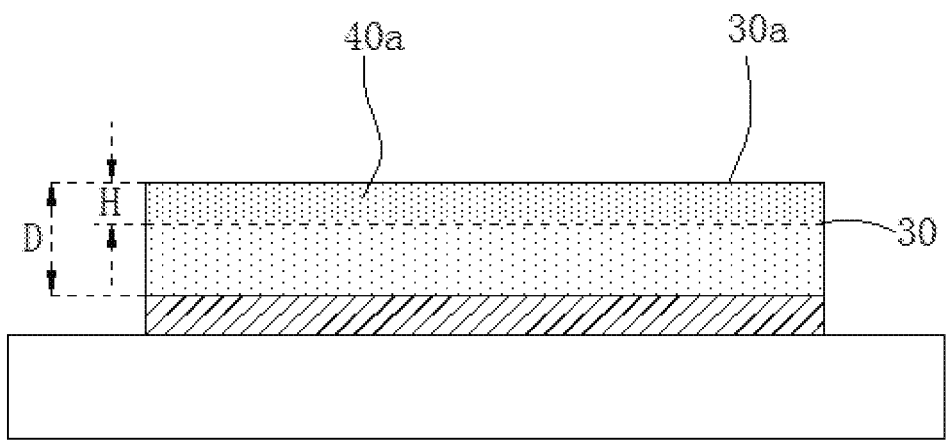

S2: as shown in FIG. 2c, implanting the first metal ions into the upper surface 30a of the copper metal layer 30 by an ion implantation process, and forming ions in a first depth H within an upper surface 30a of the copper metal layer 30 to form an ion doped layer 40a. The first depth H of the ion implantation needs to be specifically set according to the thickness of the alloy layer to be formed and is necessary to satisfy that the first depth H is smaller than the thickness D of the copper metal layer 30.

Figure 2D:
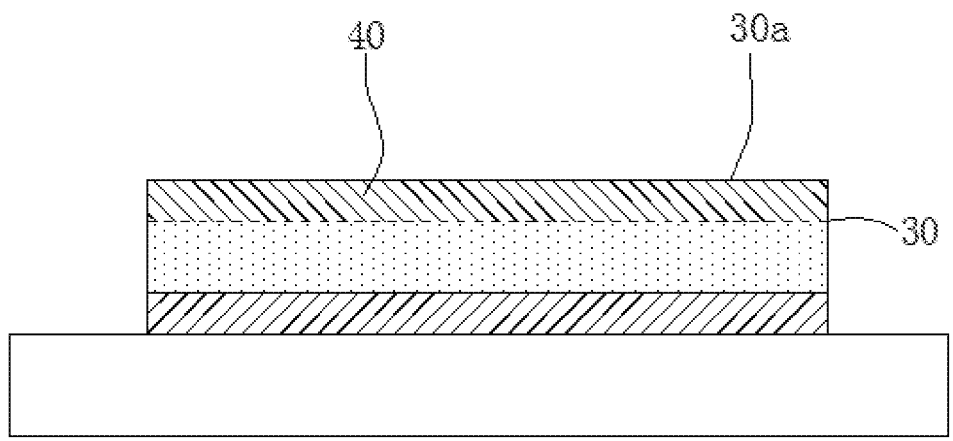

S30: as shown in FIG. 2d, the copper metal layer 30 is annealed by a vacuum annealing process, so that the first metal ion and the copper grain are combined by a metal bond, and the ion doped layer 40a is converted into a copper alloy layer 40. Thus, the copper alloy layer 40 is formed at a certain depth within the upper surface 30a of the copper metal layer 30, and finally the electrode structure 1 described in the present embodiment is obtained.

In step S30, the vacuum annealing process is performed in a vacuum annealing furnace, and the annealing temperature can be selected from 200° C. to 400° C., and the annealing time can be selected from 10 min to 120 min.

It should be noted that, when the electrode structure 1 is applied to some specific semiconductor devices, such as a TFT, the electrode structure must be prepared into a pattern, and therefore, after the above step S30 is completed, photolithography can be performed to etch the electrode structure 1 to form a patterned electrode structure.

The electrode structure and the manufacturing method thereof as provided in the above embodiments use copper as an electrode material and can avoid the oxidation problem of the surface of the copper thin film layer, applicable to a semiconductor device, and able to improve the signal transmission capability of the semiconductor device.

Embodiment 2

Figure 3:
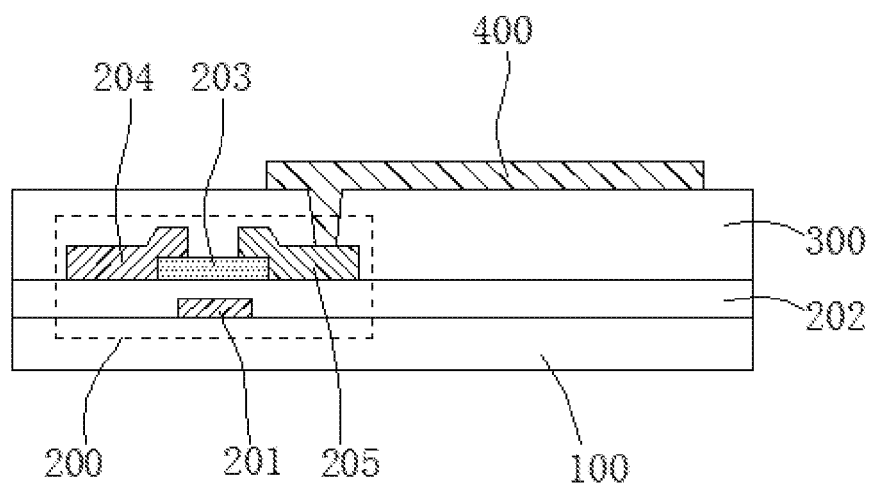
FIG. 3 is a schematic view showing the structure of array substrate of the second embodiment of the present invention.

The present embodiment provides an array substrate. As shown in FIG. 3, the array substrate comprises a substrate 100, a TFT 200 and a pixel electrode 400 disposed on the substrate 100; a plurality of TFTs 200 is arranged in an array (only one of which is exemplarily shown in FIG. 3). The TFT array is disposed on the base substrate 100, and the TFT 200 is covered with a planarization layer 300, and the pixel electrode 400 is formed on the planarization layer 300. Each of the TFTs 200 is electrically connected to a pixel electrode 400 through a via provided in the planarization layer 300.

The TFT 200 comprises a gate electrode 201, a gate insulating layer 202, a semiconductor active layer 203, a source electrode 204, and a drain electrode 205. Specifically, as shown in FIG. 3, the gate electrode 201 is formed on the substrate 100, and the gate insulating layer 202 is formed on the substrate 100 and covers the gate electrode 201. The semiconductor active layer 203 is formed on the gate insulating layer 202 opposite to the gate electrode 201, and the source electrode 204 and the drain electrode 205 are formed on the gate insulating layer 202 spaced from each other. The source electrode 204 and the drain electrode 205 are respectively connected to both ends of the semiconductor active layer 203. The pixel electrode 400 is electrically connected to the drain electrode 205 through a via disposed in the planarization layer 300.

In the present embodiment, the specific structures of the gate electrode 201, the source electrode 204, and the drain electrode 205 and the manufacturing method thereof are of the electrode structures provided by Embodiment 1 of the present invention and a manufacturing method thereof. Copper is used as the electrode material of the TFT on the array substrate, and the surface of the copper layer can be prevented from oxidation in the electrode structure, thereby improving the signal transmission capability of the array substrate and reducing hidden dangers of electrostatic discharge in the TFT.

Furthermore, the array substrate further comprises the scan line and the data line, and the scan line is generally formed in the same structural layer as the gate electrode 201 and is formed in the same process, and the data line, the source electrode 204 and the drain electrode 205 are located in the same structural layer and are formed in the same process. At this time, the scan line and the data line also have the same structural film layer as the electrode structure 1, which further reduces wiring resistance in the array substrate and enables the array substrate to have better signal transmission capability.

It should be noted that, in the present embodiment, the TFT 200 is a bottom gate type TFT, and in other embodiments, the TFT 200 may also be a TFT of other structures, such as, a top gate type TFT. The TFT 200 may be disposed with only the gate electrode 201 as the electrode structure provided by Embodiment 1 of the present invention, or only the source electrode 204 and the drain electrode 205 may be disposed as the electrode structure provided in Embodiment 1 of the present invention.

It should be noted that each of the embodiments in this specification is described in a progressive manner, each of which is primarily described in connection with other embodiments with emphasis on the difference parts, and the same or similar parts may be seen from each other. For the device embodiment, since it is substantially similar to the method embodiment, the description is relatively simple and the relevant description may be described in part of the method embodiment.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An electrode structure, comprising a copper metal layer formed on a substrate, wherein the copper metal layer, being doped with a first metal ion within a first depth from upper surface, the first metal ion and a copper grain being combined by a metal bond to form a copper alloy layer; the first depth being less than thickness of the copper metal layer, and the first metal ion being a metal ion having corrosion resistance and an ionic radius smaller than a gap between copper grains.

2. The electrode structure as claimed in claim 1, wherein the first metal ion is selected from one or more of nickel ion, tungsten ion, and tantalum ion.

3. The electrode structure as claimed in claim 2, wherein the first depth range is 100 Å to 500 Å.

4. The electrode structure as claimed in claim 1, wherein a connection metal layer is disposed between the copper metal layer and the substrate.

5. The electrode structure as claimed in claim 4, wherein the material of the connecting metal layer is molybdenum or titanium or a combination of the two.

6. The electrode structure as claimed in claim 5, wherein the connecting metal layer has a thickness of 100 Å to 500 Å.

7. The electrode structure as claimed in claim 1, wherein the copper metal layer has a thickness of 2000 Å to 10000 Å.

8. An array substrate, comprising: a substrate and a thin film transistor (TFT) disposed on the substrate, the TFT having a gate electrode, a semiconductor active layer, a source electrode, and a drain electrode, wherein at least one of the gate electrode, the source electrode, and the drain electrode employing an electrode structure as described below;

the electrode structure comprising a copper metal layer formed on a substrate, wherein the copper metal layer, being doped with a first metal ion within a first depth from upper surface, the first metal ion and a copper grain being combined by a metal bond to form a copper alloy layer; the first depth being less than thickness of the copper metal layer, and the first metal ion being a metal ion having corrosion resistance and an ionic radius smaller than a gap between copper grains.

9. The array substrate as claimed in claim 8, wherein the first metal ion is selected from one or more of nickel ion, tungsten ion, and tantalum ion.

10. The array substrate as claimed in claim 9, wherein the first depth range is 100 Å to 500 Å.

11. The array substrate as claimed in claim 8, wherein a connection metal layer is disposed between the copper metal layer and the substrate.

12. The array substrate as claimed in claim 11, wherein the material of the connecting metal layer is molybdenum or titanium or a combination of the two.

13. The array substrate as claimed in claim 12, wherein the connecting metal layer has a thickness of 100 Å to 500 Å.

* * * * *